(12) United States Patent
Gasquet et al.

(10) Patent No.: US 7,210,833 B2
(45) Date of Patent: *May 1, 2007

(54) METHOD OF FIXING A POWER LIGHT-EMITTING DIODE ON A RADIATOR, AND A SIGNALLING DEVICE COMPRISING SUCH A DIODE

(75) Inventors: Jean-Claude Gasquet, Bobigny (FR); Alcina Tanghe, Bobigny (FR)

(73) Assignee: Valeo Vision, Bobigny Cedex (FR)

( * ) Notice: Subject to any disclaimer, the term of this patent is extended or adjusted under 35 U.S.C. 154(b) by 110 days.

This patent is subject to a terminal disclaimer.

(21) Appl. No.: 10/808,650

(22) Filed: Mar. 25, 2004

(65) Prior Publication Data

US 2004/0190294 A1 Sep. 30, 2004

(30) Foreign Application Priority Data

Mar. 27, 2003 (FR) .................................. 03 03840

(51) Int. Cl.
*B60Q 1/00* (2006.01)
(52) U.S. Cl. ............... 362/548; 362/294; 362/547; 362/800; 219/121.64
(58) Field of Classification Search ............... 362/227, 362/249, 259, 294, 487, 540, 543–545, 800, 362/549, 547–548; 439/485, 487; 361/702, 361/717–719, 806, 808–809, 820, 823; 219/86.1, 219/121.64; 257/99; 313/512; 445/23–25
See application file for complete search history.

(56) References Cited

U.S. PATENT DOCUMENTS

| | | | |
|---|---|---|---|
| 4,023,005 A | 5/1977 | Bolin | |
| 4,707,067 A * | 11/1987 | Haberland et al. | 385/90 |
| 5,631,990 A * | 5/1997 | Hashizume | 385/92 |
| 6,259,192 B1 * | 7/2001 | Becker et al. | 313/318.03 |
| 6,428,189 B1 * | 8/2002 | Hochstein | 362/373 |
| 6,541,800 B2 * | 4/2003 | Barnett et al. | 257/98 |
| 6,597,114 B1 * | 7/2003 | Tagawa et al. | 313/623 |
| 6,821,143 B2 * | 11/2004 | Gasquet et al. | 439/485 |
| 2001/0030866 A1 | 10/2001 | Hochstein | |
| 2002/0067621 A1 | 6/2002 | Kugler et al. | |
| 2003/0002825 A1 * | 1/2003 | Karker et al. | 385/92 |
| 2003/0218417 A1 * | 11/2003 | Chin | 313/498 |
| 2004/0264540 A1 * | 12/2004 | Iehisa | 372/97 |

FOREIGN PATENT DOCUMENTS

| DE | 4221564 | 1/1994 |
|---|---|---|
| EP | 1 139 019 | 2/2001 |

OTHER PUBLICATIONS

Whitehead, et al, "Soldering with light!", Assembly Automation, vol. 15, No. 2, 1995, pp. 17-19.
French Search Report dated Dec. 5, 2003.

* cited by examiner

*Primary Examiner*—Sandra O'Shea
*Assistant Examiner*—Jason Moon Han
(74) *Attorney, Agent, or Firm*—Morgan and Finnegan, LLP

(57) ABSTRACT

Method of fixing a power light-emitting diode (1) having a metallic base (2) to a metallic heat-radiating element (3), according to which the base (2) of the light-emitting diode is fixed to the radiating element (3) by laser spot welding (11).

14 Claims, 3 Drawing Sheets

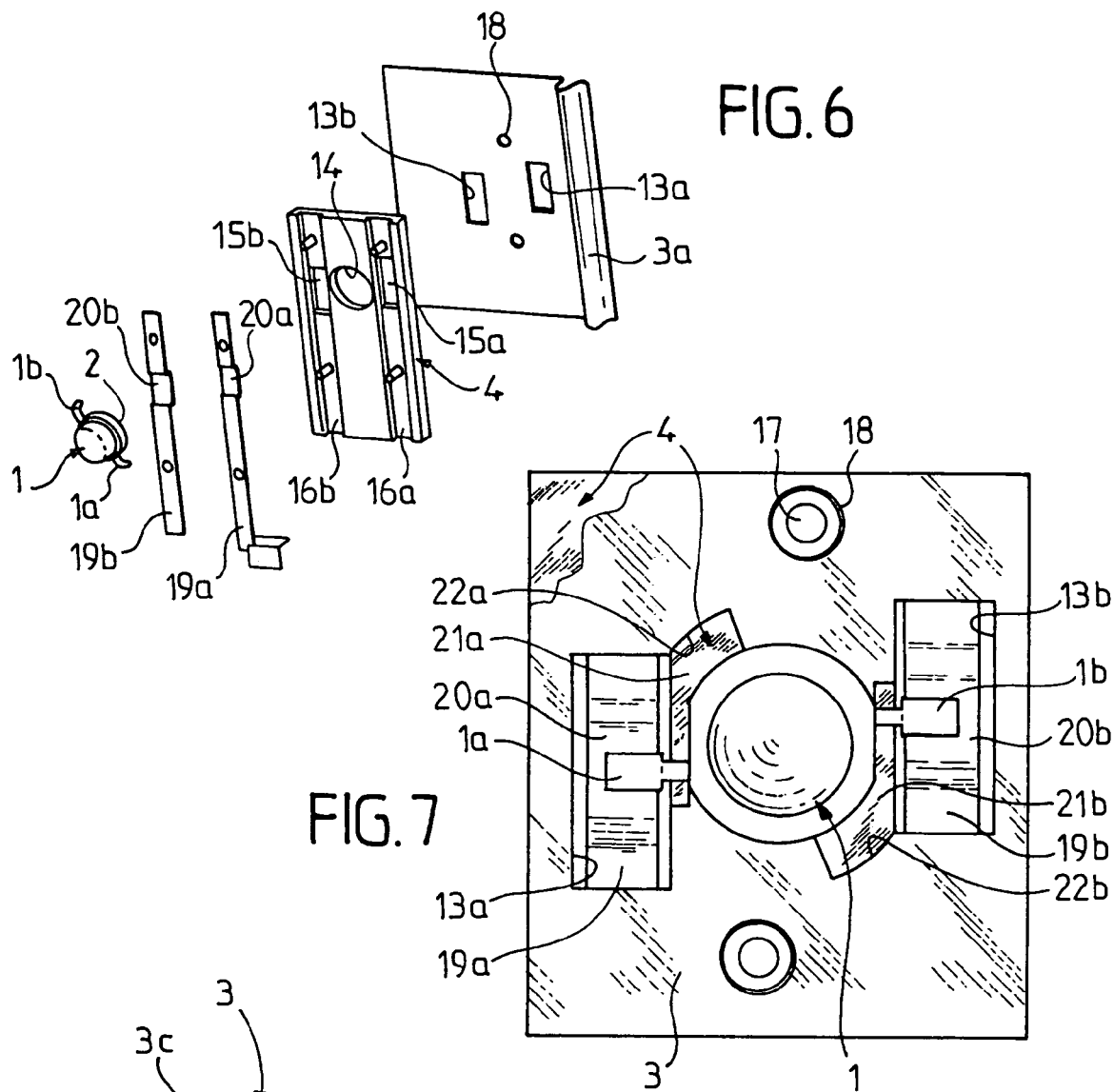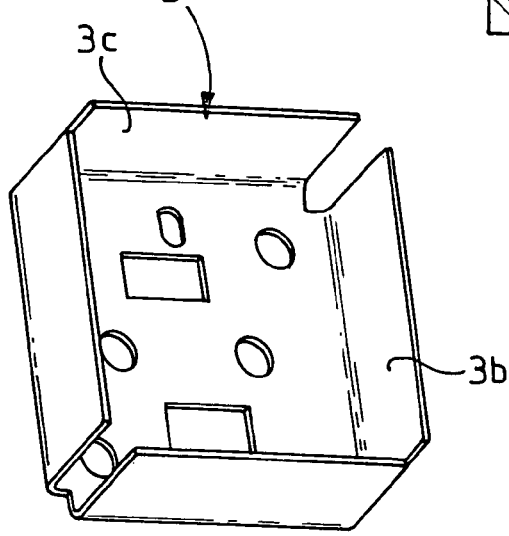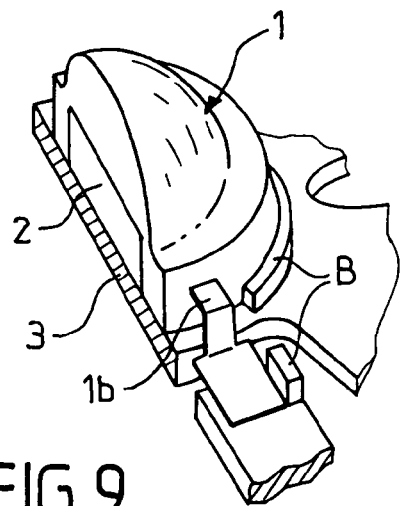

METHOD OF FIXING A POWER LIGHT-EMITTING DIODE ON A RADIATOR, AND A SIGNALLING DEVICE COMPRISING SUCH A DIODE

The invention relates to a method for fixing a power light-emitting diode (LED) to a metallic radiating element, generally based on copper.

The expression "power light-emitting diode" means a diode whose thermal energy to be dissipated requires a specific metallic base, for example made from copper, serving as a supply and/or radiator.

It is known that good heat dissipation is necessary for light-emitting diodes, since their light output decreases if the junction temperature increases. A power diode is thus generally provided with a metallic body or base, for example made from copper, making it possible to establish effective thermal contact with a radiating element for dissipating the heat produced.

The fixing of the power light-emitting diode and its cooling constitute a problem to be resolved in order to optimise the light output.

For fixing, it is necessary to take account of the fact that a light-emitting diode is a relatively fragile electronic component which is sensitive to heat. Thus, in order to avoid any risk of damage to the light-emitting diode, it was proposed, in the document EP-A-1 387 870 in the name of the Applicant, to provide the fixing of the base of the diode to the radiator by a heat-conducting adhesive.

This method, whilst giving satisfaction, complicates the sequence of fixing operations by the use of an additional component, namely the adhesive, sensitive to storage conditions, requiring specific deposition means and, above all, leading to an extension to the manufacturing cycle through a relatively long cross-linking time. In addition, it is necessary to provide means of temporary holding of the diode on its radiator until the adhesive ensures sufficient mechanical holding, that is to say at least throughout the cross-linking period.

The aim of the invention is in particular to provide a method of fixing the light-emitting diode to the radiating element which makes it possible to reduce the duration of the manufacturing cycle, to simplify the manufacturing means and to provide repeatability of the process of connecting the diode to its radiator, whilst preventing damage to this diode.

According to the invention, the method of fixing the power light-emitting diode having a metallic base to a heat-radiating metallic element is characterised by the fact that the base of the light-emitting diode is fixed to the radiating element by laser spot welding.

Preferably, use is made of a radiating element coated with a layer of a metal, for example nickel, able to absorb the energy of a laser light.

The Applicant found that a laser spot welding of the base did not cause any damage to the light-emitting diode. The presence of a layer of metal absorbing the laser light on the radiator helps to establish an effective weld.

Advantageously, the welding spots are produced substantially in a closed contour, for example circular, preferably close to the external periphery of the base.

The invention also relates to an indicator or lighting device for a car comprising a power light-emitting diode whose metallic base is fixed to a heat-radiating metallic element, this device being characterised by the fact that the base of the diode is fixed by laser spot welding to the radiating element.

The radiating element is preferably covered with a layer of a metal absorbing the laser radiation, for example a layer of nickel.

The centres of the welding spots are distributed substantially regularly over a contour parallel to the external perimeter of the base, for example circular. This contour is preferably close to the external periphery of the base.

Advantageously, means of centring the body of the diode are provided on the heat-radiating element. These centring means can comprise projections produced in the radiating element.

The electrodes of the diode can also be spot welded to the laser with conductive lugs.

According to a first possibility, the heat-radiating element to which the base of the light-emitting diode is fixed is attached to an insulating support which is situated on the opposite side to the diode with respect to the radiating element, this insulating support comprising electrical connection lugs, each electrode of the diode being connected respectively to a lug, the said insulating support comprising openings in line with the base and electrodes of the diode for the passage of the laser welding beam.

According to a second possibility, the heat-radiating element is a pre-cut metallic circuit, for example made from copper, whose various conductors are connected together by thin connections referred to as shunts.

Onto this circuit there is overmoulded an electrically insulating plastic material, serving as an insulating support, the moulded-on plastics material comprising openings in line with the position of the base and the electrodes of the diode for the laser welding beam to pass.

During this operation, the shunts are cut out by means of a mechanism integrated in the mould, so that the various conductors are electrically separated from each other.

The lugs of the diode can then be welded to these conductors by laser, as before.

The connecting lugs can be stored on the side of the insulating support turned towards the radiating element.

According to a variant, the connection lugs are situated on the side of the insulating support opposite to the heat-radiating element and the connection between each connection lug and the corresponding electrode of the diode takes place through a window provided in the insulating support and another window provided in the radiating element.

According to another arrangement, the insulating support is situated on the same side as the diode with respect to the heat radiator; an opening is provided in the insulating support in line with the base of the light-emitting diode for its housing and its coming into contact with the radiator, openings also being provided for the electrodes.

The invention consists, apart from the provisions disclosed above, of a certain number of other provisions which will be dealt with more explicitly below with regard to example embodiments described with reference to the accompanying drawings, but which are in no way limiting.

In these drawings:

FIG. 6 is a view in exploded perspective, to a smaller scale, of the unit in FIG. 4 before assembly.

FIG. 7 is a plan view, to a larger scale, of a variant embodiment of the unit in FIG. 4.

FIG. 8 is a perspective view of a variant embodiment of the heat-radiating element.

FIG. 9 is a diagram in perspective with a cut-away part, illustrating a means of positioning the light-emitting diode on the radiating element.

Figure 1:
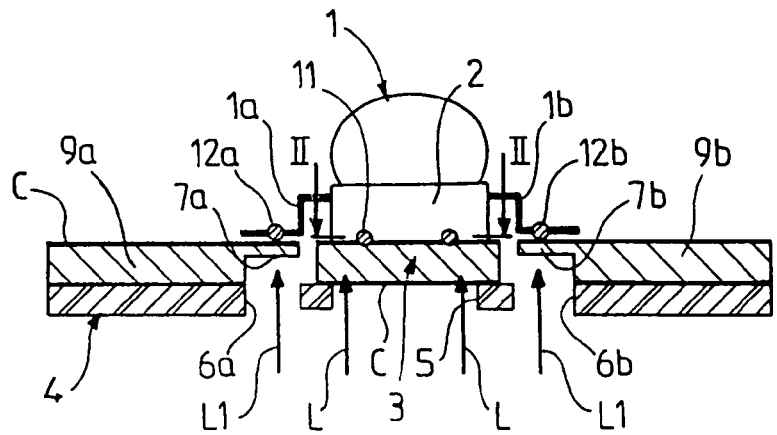
FIG. 1 is a schematic section illustrating the method of fixing the power light-emitting diode to the heat-radiating element.

Referring to the drawings, in particular to FIG. 1, it is possible to see a power light-emitting diode 1, that is to say a diode whose thermal energy to be dissipated requires a specific copper base serving as a supply and/or radiator, able for example to supply a luminous flux of at least 30 lumens and preferably 40 lumens or more, which comprises a base 2, or body, principally made from copper to allow good dissipation of the heat produced by the diode. This base 2 is generally designated by the term "slug". The diode 1 comprises two electrodes 1a, 1b generally formed by copper blades.

The diode 1 is disposed on a heat-radiating element 3 which is itself fixed to an insulating support 4 formed by a rigid plate made from electrically insulating plastics material. The support 4 can be flat, or have a curved surface, or a stepped surface. The insulating support 4 constitutes, for example, a base made from plastics material corresponding to a device holding a lighting source of an indicator light.

The radiating element 3 consists of a copper plate covered at least on its face adjacent to the base 2, preferably on both faces, with a layer C of a metal able to absorb the energy of a laser light. The layer C is preferably a layer of nickel, and its thickness is a few micrometers.

In the insulating support 4, below the base 2, there is provided an opening 5 having substantially the same shape and the same cross-section as the base 2. Two other openings 6a, 6b are provided in the support 4 below the electrodes 1a, 1b. The thickness of the support 3 vertically in line with the openings 6a, 6b can be reduced so that blades 7a, 7b are formed under the electrodes 1a, 1b.

Figure 3:
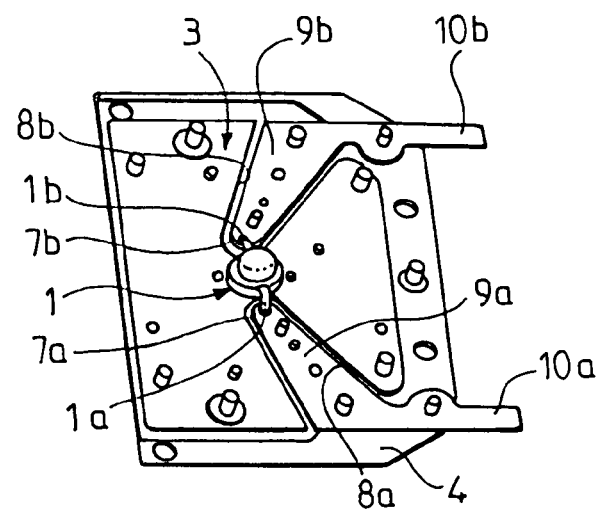
FIG. 3 is a perspective view, to a smaller scale, of an indicator unit with insulating support, heat radiator and diode fixed to the radiator.

As visible in FIG. 3, the heat-radiating element 3 comprises two opposite scallops 8a, 8b in the direction of the fixing area of the light-emitting diode 1 and corresponding to the electrodes 1a, 1b. In each scallop a lug in the form of a tongue 9a, 9b, cut in the radiating element 3, is connected by its end 7a, 7b adjacent to the diode 1 to an associated electrode 1a, 1b. The edges of each lug 9a, 9b are distant from those of the corresponding scallop so that the lugs 9a, 9b are electrically insulated from the remaining part of the radiating element 3. The lugs 9a, 9b are electrically connected to other lugs 10a, 10b, generally rectangular in shape for the electrical connection. According to FIG. 3, the lugs 10a, 10b form a single piece with the lugs 9a, 9b. In a variant, these lugs can consist of two different pieces.

The radiating element 3 and the lugs 9a, 9b are fixed to the insulating support 4 by means of projecting studs on the plastic element 4 passing through holes provided in the radiator 3 and the lugs 9a, 9b, as can be seen in FIG. 3.

Figure 2:
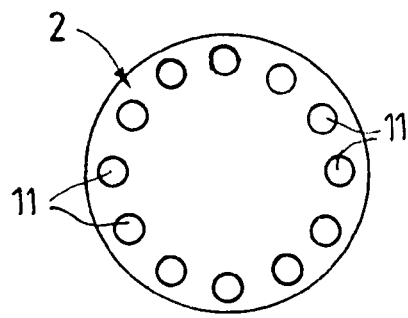
FIG. 2 is a schematic section along the line II—II in FIG. 1 showing a distribution of welding spots.

The base 2 of the diode is fixed to the radiating element 3 by laser spot welding. In FIG. 1, the laser beam used for fixing the base 2 is shown diagrammatically by arrows L. The welding spots 11 between the diode base 2 and the radiating element 3 correspond to the points of impact of the laser rays. The centres of the successive welding spots 11 can be distributed substantially regularly over a contour parallel to the external perimeter of the base, for example circular, as illustrated in FIG. 2. This contour is preferably close to the external perimeter of the base 2, which reduces the thermal influence on the junction of the diode.

According to a second possibility, the heat-radiating element is a pre-cut metallic circuit, for example made from copper, whose various conductors are connected together by thin connections referred to as shunts.

On this circuit there is moulded an electrically insulating plastics material, serving as an insulating support, the moulded-on plastics material comprising openings in line with the location of the base and electrodes of the diode for passage of the laser welding beam.

During this operation, the shunts are cut out by a mechanism integrated in the mould, so that the various conductors are electrically separated from each other.

The lugs of the diode can then be welded to these conductors by laser, as before.

Figure 10:
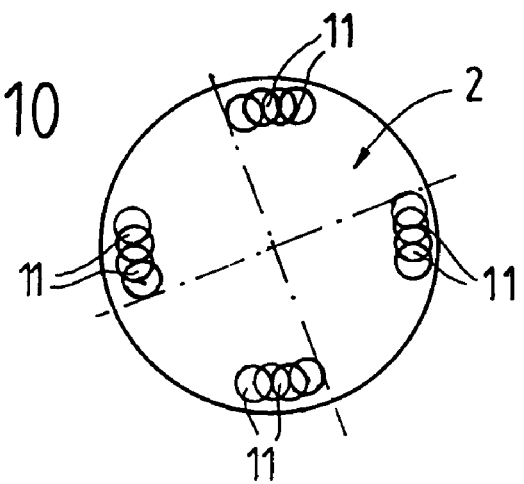
FIGS. 10 to 12 show, similar to FIG. 2, other distributions of welding spots.
Figure 11:
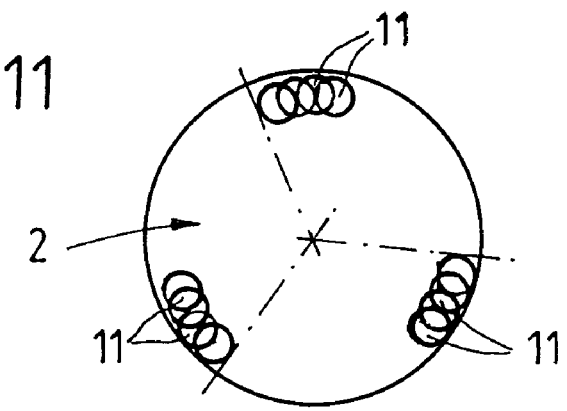
Figure 12:
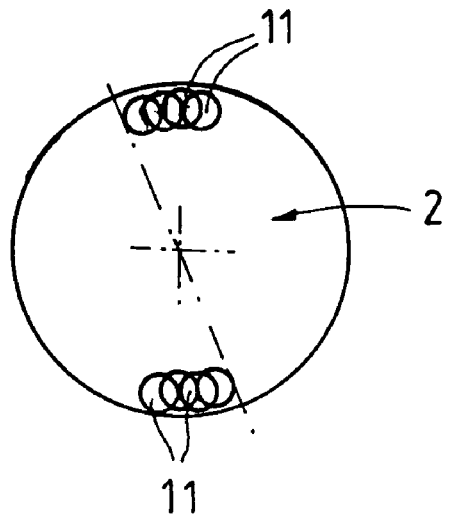

FIGS. 10 to 12 show possible variants of distribution of welding spots 11, partly overlapping. According to FIG. 10, four groups of four welding spots 11 are angularly distant by 90° on the same circumference. In each group, the perimeter of a following welding spot passes substantially through the centre of the previous welding spot. FIG. 11 shows three groups of four welding spots 11 angularly distant by 120°, and FIG. 12 shows two groups of four welding spots 11 which are diametrically opposed.

Whatever the type of distribution, the welding spots 11 are preferably almost tangent internally to the external perimeter of the base.

The laser used is a pulsed laser proceeding by successive firings. The power of the firings and the number of firings for a welding spot 11 are chosen so as to provide optimum resistance without creating a rise in temperature of the base 2 liable to damage the diode junction.

The energy of the laser beam is well absorbed by the layer of nickel C, which makes it possible to obtain good-quality welding spots 11.

The fixing of the electrodes 1a, 1b to the blades 7a, 7b is also achieved advantageously by spot welding with the laser beam. The arrows L1, in FIG. 1, show diagrammatically the laser rays used for welding the electrodes. These rays pass through the openings 6a, 6b; their points of impact determine the welding spots 12a, 12b at the interface of the electrodes 1a, 1b and blades 7a, 7b.

In general terms, in order to obtain good welds, efforts are made to make the thicknesses of the welded pieces as close to each other as possible. In the example considered, the blades 7a, 7b have a reduced thickness compared with that of the radiator 3 since the electrodes 1a, 1b themselves have a reduced thickness with respect to the base 2.

The method of the invention makes it possible to achieve fixing by "autogenous" welding between the radiating element 3, produced from copper coated with a layer C of nickel, and the base 2. This method makes it possible to achieve firstly the physical fixing of the diode 1 to its radiating support 3 and secondly its electrical connection by connection of the electrodes 1a, 1b with the lugs 9a, 9b. The duration of the manufacturing cycle is greatly reduced and the manufacturing means are simplified since only one method of fixing by laser spot welding is used. Laser welding provides repeatability of the method of connecting the diode by control of the control parameters.

The light-emitting diode 1 is generally used as a light source in a more complex optical assembly integrating various elements such as reflector and lens. In any optical system, the spatial position of the source is very important.

In order to ensure the correct geometric positioning of the diode 1 on the radiating element 3, it is possible to provide assistance for the positioning of the diode 1 on the surface of the radiator 3 as illustrated in FIG. 9. For this purpose, the specific ductile properties of copper are used and, when the radiator 3 is made, there is produced, via a cutting tool, a physical centring means for example in the form of one or more projections B, on the surface of the radiator 3, able to cooperate with the contour of the diode 1 and the electrodes for positioning. The projections B can be continuous or discontinuous and can be provided for a diode contour of any shape, circular, rectangular or other.

This means of assistance for positioning is particularly advantageous for automatic machines for placing the diode 1 on its radiating element 3.

It should also be noted that the fixing of the base 2 on the radiating element 3 is almost immediate and that it is not necessary, as in the case where the base is fixed by an adhesive to the radiator 3, to provide temporary mechanical holding of the diode 1 relative to the radiator 3 by the electrodes 1a, 1b and the lugs 9a, 9b during the time necessary for the cross-linking of the adhesive. Thus the lugs 9a, 9b can be made immediately independent of the rest of the radiating element 3.

The implementation of the cycle of fixing the diode 1 on its support is as follows.

The diode 1 is positioned on the radiating element 3, the electrodes 1a, 1b being maintained in contact with the tongues 9a, 9b, whilst the base 2 is maintained in contact with the radiator 3.

The welding spots 11 and 12a, 12b are produced in a single cycle obtained by controlling a laser via a computer program managed by computer. The laser beam is directed by a system of two internal mirrors known by the term scan head.

All the parameters corresponding to the firing conditions (laser pulse) are also managed by computer, thus ensuring a high quality of autogenous welding.

The duration of a firing is a few milliseconds, the frequency of the firing is a few hertz (Hz). The complete welding operation is performed with a number of firings varying from a few units to several tens according to the required tear resistance.

The complete fixing cycle for a diode is a few tens of seconds.

Figure 4:
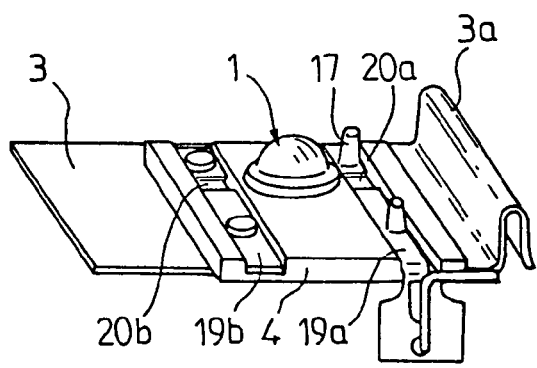
FIG. 4 is a perspective view of a variant embodiment of the unit in FIG. 3.
Figure 5:
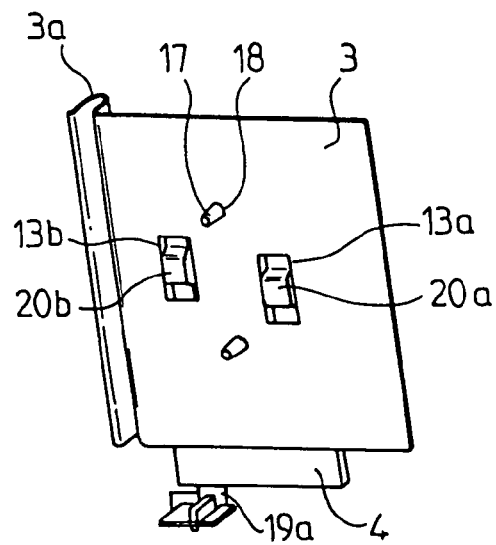
FIG. 5 is a perspective view of the underside of the unit in FIG. 4.

Referring to FIGS. 4 to 6, a variant embodiment can be seen according to which the insulating support 4 is situated on the same side as the diode 1 with respect to the radiating element 3, whilst according to FIG. 1 the insulating support 4 is situated on the opposite side to the diode with respect to the radiator 3.

The radiating element 3 still consists of a copper plate coated with a layer of nickel, but the useful surface of the radiator 3 is at a maximum since the lugs 9a, 9b in FIG. 3 have disappeared. The radiator 3 can have, on one of its edges, a fold 3a for serving for fixing and increasing the heat exchange surface. The radiator 3 comprises two rectangular windows 13a, 13b constituting openings corresponding to the electrodes 1a, 1b of the diode 1.

The insulating support 4 comprises an opening 14 for housing the diode 1 and, on each side of this opening, two rectangular windows 15a, 15b in correspondence with the electrodes. Two parallel grooves 16a, 16b are provided in the face of the insulating support 4 opposite to the radiator 3. These grooves are parallel to one of the directions of the sides of the rectangular insulating support 4, for example parallel to the direction of the large sides. The fixing of the radiator 3 to the support 4 is provided by means of studs 17 projecting on the face of the support 4 opposite to the radiator 3, cooperating with holes 18 provided in the radiator 3. The grooves 16a, 16b are tangent to the opening 14 through their internal edges. The windows 15a, 15b open out in the bottom of the grooves 16a, 16b.

Two blades or lugs 19a, 19b, made from electrically conductive material, for example copper, rectangular in shape, are provided so as to fit in and be fixed in the grooves 16a, 16b. The fixing of the blades 19a, 19b is achieved by cooperation of studs provided projecting in the bottom of the grooves 16a, 16b and corresponding holes provided in the blades 19a, 19b. Each blade 19a, 19b comprises a part 20a, 20b deformed out of the plane of the blade and constituting a sort of bridge projecting on one side of the blade. This part 20a, 20b of each blade is designed to come to be housed in the corresponding window 15a, 15b of the insulating support 14 and in the corresponding window 13a, 13b of the radiator 3. The blades 19a, 19b are disposed so that the parts 20a, 20b project in the direction of the radiator 3 through the windows 15a, 15b. The insulating support 4 holds the blades 19a, 19b so that the projections 20a, 20b remain separated from the edges of the openings 13a, 13b and therefore electrically insulated from the radiator 3.

The concave hollow areas of the parts 20a, 20b are open on the side opposite to the radiator 3 and receive the electrodes 1a, 1b.

The fixing of the base of the diode 1 to the radiator 3 is achieved by directing the laser beam firings against the face of the radiator 3 opposite to the insulating support 4, in the area situated against the base 2.

The spot welding of the electrodes 1a, 1b is provided by directing the laser beam firings against the parts 20a, 20b of the lugs 19a, 19b which appear through the openings 13a, 13b on the side opposite to the insulating support 4.

The electrical connection of the diode 1 to the associated circuit is provided by the connection to the lugs 19a, 19b.

FIG. 7 illustrates another variant embodiment according to which the insulating support 4 is situated, as in FIG. 3, on the side of the radiator 3 opposite to the diode 1. Unlike FIG. 3, according to FIG. 7 the blades or lugs 19a, 19b for electrical connection of the electrodes 1a, 1b are disposed on the side of the insulating support 4 opposite to the radiator 3.

An exploded perspective view of the assembly of FIG. 7 would correspond substantially to the representation in FIG. 6 but the diode 1 would be on the side of the radiator 3 opposite to the support 4.

According to FIG. 7, the base of the diode 1 is in direct contact with the solid area of the radiator 3 lying between the windows 13a, 13b on the opposite side to the support 4, which comprises an opening 14, as in FIG. 6, in line with the base of the diode to allow passage of the laser beam.

The fixing of the radiator 3 to the insulating support 4 is provided by studs 17 made from plastics material passing through the holes 18 provided in the radiator and crushed in order to lock the fixing.

The correct geometric positioning of the radiator 3 on the insulating support 4 is advantageously ensured by means of projecting parts 21a, 21b provided on the insulating support 4 in order to cooperate with corresponding scallops 22a, 22b provided in the radiator 3. The convex areas of the parts 20a, 20b of the blades 19a, 19b appear through the openings 13a, 13b substantially flush with the surface of the radiator 3. The electrodes 1a, 1b are applied to the top surface of the parts 20a, 20b.

The fixing by laser spot welding takes place from the rear, with respect to FIG. 7, through the opening 14 in the insulating support 4 for fixing the base of the diode 1, and through the openings 15a, 15b of the support 4 for the spot welding of the electrodes 1a, 1b.

The surface of the openings 13a, 13b provided in the radiator 3 is reduced with respect to that of the scallops in FIG. 3 surrounding the tongues 9a, 9b. The surface of the radiator 3 providing the heat exchanges in accordance with the embodiments in FIGS. 4 to 7 is therefore larger and allows better heat dissipation.

FIG. 8 illustrates a variant embodiment of the radiating device 3 which has, on its edges, parts raised at a right angle 3b, 3c constituting fins assisting the heat dissipation with reduced bulk and thus optimising the ratio between size and radiative effect.

The cycle for fixing the diode 1 to the radiator according to the variants in FIGS. 4 to 6 and FIG. 7 is derived from the above explanations.

A first step consists of fixing the blades 20a, 20b to the insulating support 4 by cooperation of the studs provided on this support and holes provided in the blades.

The radiator 3 is then fixed to the insulating support 4 also by cooperation of studs and holes.

The light-emitting diode 1 is next positioned on the radiator 3, either on the side of the insulating support 4 with positioning of the base 2 in the opening 14 (FIGS. 4 to 6) or on the opposite side to the insulating support 4 (FIG. 7). Contact of the base of the diode 1 with the radiator 3 and of the electrodes 1a, 1b with the parts 20a, 20b is provided. Next the operation of welding by laser ray is initiated.

The invention makes it possible to have a series of production operations restricted in time and space. It eliminates the operations related to the use of an adhesive as a fixer and the obligatory curing cycle.

The invention assists the environment of the work station by eliminating any specific surface treatment or any aggressive component related to an adhesive bonding process.

The invention claimed is:

1. A method of fixing a power light-emitting diode having a metallic base to a metallic heat-radiating element comprising the step of laser spot welding the base of the light-emitting diode to the radiating element, wherein the heat-radiating element is coated with a layer of a metal, able to absorb the energy of a laser light.

2. A method according to claim 1, wherein each welding spot has a centre and wherein the centres of the welding spots are distributed substantially regularly over a contour parallel to the external perimeter of the base.

3. A method according to claim 1, wherein the welding spots are produced in the vicinity of the external perimeter of the base.

4. An indicating or lighting device for a car, comprising a power light-emitting diode having a base mainly made from copper which is fixed to a metallic heat-radiating element, wherein the base of the diode is fixed by laser spot welding to the heat-radiating element, which is covered with a layer of a metal for absorbing laser radiation.

5. A device according to claim 4, wherein each welding spot has a centre and wherein the centres of the welding spots are distributed substantially regularly over a contour parallel to the external perimeter of the base.

6. A device according to claim 5, wherein the welding spots are distributed adjacent to the external perimeter of the base.

7. A device according to claim 4, comprising projections on the radiating element for centering the base of the diode.

8. A device according to claim 4, wherein electrodes from the diode are laser spot welded to conductive lugs.

9. A device according to claim 4, wherein the heat-radiating element to which the base of the light-emitting diode is fixed is attached to an insulating support situated on the opposite side to the diode with respect to the radiating element, said insulating support comprising electrical connection lugs, each electrode of the diode being connected respectively to a lug, the insulating support comprising openings in line with the base and openings in line with electrodes from the diode for passage of the laser welding beam.

10. A device according to claim 9, wherein the connecting lugs are situated on the side of the insulating support disposed towards the radiating element.

11. A device according to claim 9, wherein the connecting lugs are situated on the side of the insulating support opposite to the heat-radiating element and the connection between each connecting lug and the corresponding electrode of the diode is effected through a window provided in the insulating support and another window provided in the radiating element.

12. A device according to claim 4, wherein the heat-radiating element to which the base of the light-emitting diode is fixed is attached to an insulating support situated on the same side as the diode with respect to the heat-radiating element, an opening being provided in the insulating support in line with the base of the light-emitting diode for housing the base and providing contact with the heat-radiating element, and openings being provided for electrodes from the light-emitting diode.

13. A device according to claim 4, wherein an insulating support is moulded onto the heat-radiating element, providing openings in line with the location of the base and electrodes of the light-emitting diode.

14. A device according to claim 4, wherein the heat-radiating element is principally composed of copper.

* * * * *